United States Patent [19]

Morlion et al.

[11] Patent Number: 5,163,835
[45] Date of Patent: Nov. 17, 1992

[54] CONTACT ASSEMBLY WITH GROUNDING CONDUCTOR SUPPORT

[75] Inventors: Danny L. C. Morlion, Ghent, Belgium; Udo H. Schoss, Hattingten, Fed. Rep. of Germany

[73] Assignee: Burndy Corporation, Norwalk, Conn.

[21] Appl. No.: 714,410

[22] Filed: Jun. 12, 1991

[30] Foreign Application Priority Data

Jun. 14, 1990 [NL] Netherlands ............... 9001347

[51] Int. Cl.⁵ .................. H01R 9/09; H01R 23/72
[52] U.S. Cl. ........................... 439/67; 439/62; 439/79; 439/108; 439/682; 439/858; 439/886
[58] Field of Search ............ 439/62, 67, 77, 492, 439/493, 79, 101, 108, 842, 886, 682, 83, 858

[56] References Cited

U.S. PATENT DOCUMENTS

| | | | |
|---|---|---|---|
| 3,221,286 | 11/1965 | Fedde | 439/67 |
| 3,410,369 | 9/1968 | Palmateer et al. | 339/17 |
| 4,650,723 | 3/1987 | Furuya | 428/622 |
| 4,662,702 | 5/1987 | Furuya | 339/17 |
| 4,755,147 | 5/1988 | Young | 439/77 |
| 4,911,643 | 3/1990 | Perry et al. | 439/67 |
| 4,913,656 | 4/1990 | Gordon | 439/75 |

FOREIGN PATENT DOCUMENTS

446980A1 9/1991 European Pat. Off.
3741706 6/1989 Fed. Rep. of Germany.

OTHER PUBLICATIONS

IBM Bulletin, Dunman, vol. 7, No. 3, p. 182, Aug. 1964.
IBM Technical Disclosure Documents, vol. 32, No. 7, p. 200, Dec. 1989—NY, N.Y.

Primary Examiner—Neil Abrams
Attorney, Agent, or Firm—Perman & Green

[57] ABSTRACT

A contact assembly with at least one signal contact and at least one ground contact, in particular for use in a connector or the like, comprises a support of resilient conductive material, an insulating intermediate layer provided on the support and at least one signal conductor supported on the insulating intermediate layer. The support is used as ground conductor and two or more adjacent contacts pads are provided for each signal conductor or each group of signals conductors adjacent a first edge of the support. One contact pad is connected with the support and the other contact pad(s) is (are) connected to the respective signal conductors.

8 Claims, 11 Drawing Sheets

CONTACT ASSEMBLY WITH GROUNDING CONDUCTOR SUPPORT

The invention relates to a contact assembly, in particular for use in a connector or the like, comprising at least one signal contact and at least one ground contact.

Such contact assemblies are generally mounted in the housing of a connector element, wherein the contacts are made as a male or a female contact. In the design of the known contacts attention has mainly been paid to the mechanical aspects of the connector assembly equiped with said contacts, in particular with respect to the forces required for coupling and decoupling the connector elements. Attention was only paid to the electrical aspects in that one aimed at realizing good reliable connections between the contacts of both connector elements. With increasing speeds of the digital signals to be transferred, i.e. decreasing rise times, the electrical performance of the contacts as a circuit element becomes important. In the known connector assemblies problems occur with higher signal speeds with respect to cross-over between signal contacts, transmission losses, reflections and ground bounce or switching noise. Up to the present it is attempted to obviate these problems by mounting the signal and ground contacts in a suitable distribution in the connector elements, wherein however these problems cannot be eliminated below rise times of 0.6 ns.

European patent application 91200396 of the same applicant discloses a connector assembly, wherein these problems are obviated in that outer signal conductors connected to ground are provided, each of said outer signal conductors enclosing one or more signal contacts. Although said problems are eliminated in an effective manner by this connector assembly, the number of signal connections per unit surface in this connector assembly is restricted.

The invention aims to provide a contact assembly of the above-mentioned type, wherein said problems which may occur at high speeds when used in a connector, can be eliminated by such a construction of the contact assembly itself that the performance of each signal contact as a circuit element can be predetermined and said signal distortions can be minimized, whereas moreover the number of signal connections per unit surface can be significantly increased.

To this end, the invention provides a contact assembly with at least one signal contact and at least one ground contact, in particular for use in a connector or the like, comprising a support of resilient conductive material, an insulating intermediate layer provided on the support and at least one signal conductor supported on the insulating intermediate layer, wherein the support is used as ground conductor characterized in that two or more adjacent contact pads are provided for each signal conductor or each group of signal conductors adjacent a first edge of the support, wherein one contact pad is connected with the support and the other contact pad(s) is (are) connected to the respective signal conductors.

In this manner a contact assembly is obtained, wherein a signal conductor with the opposite support part separated from said signal conductor by the intermediate layer, forms a transmission line, wherein a desired impedance of 50 or 75 ohm, for example, can be obtained by a suitable choise of the thickness of the insulating intermediate layer and the width of the signal conductor. Thereby, the electrical performance of the contacts can be taken into account in designing the overall system from the beginning. The above-mentioned signal distortions will not occur at the contacts according to the invention.

Actually, the mechanical and electrical functions of the signal contacts are separated in the contact assembly according to the invention, wherein the support performs the mechanical functions for the signal contacts and operates further as ground contact. The signal conductors operating as signal contacts can be designed for optimal signal transmission properties, wherein it is not necessary to take the mechanical properties into account. Thereby an excellent signal integrity can be guaranteed, because the signal contacts have a controlled impedance and moreover a low capacity and low inductance. Further the contact assembly according to the invention has the important advantage that a connector with a high density of signal contacts can be manufactured, because actually all contacts are signal contacts and no space is occupied by separate ground contacts. The manufacturing costs of the contact assembly according to the invention are relatively low, because a tooling change is not required to obtain contacts with different electrical properties or a different pattern of ground and signal connections.

The invention will be further explained by reference to the drawings in which some embodiments of a contact assembly according to the invention are schematically shown.

Figure 1:
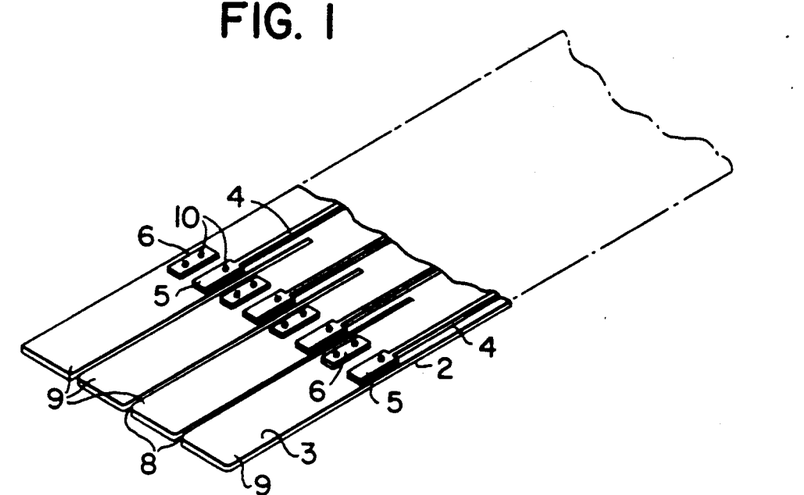
FIG. 1 is a perspective view of an embodiment of the contact assembly according to the invention in a flat position, wherein the pattern of signal conductors and contact pads can be seen.
Figure 2:
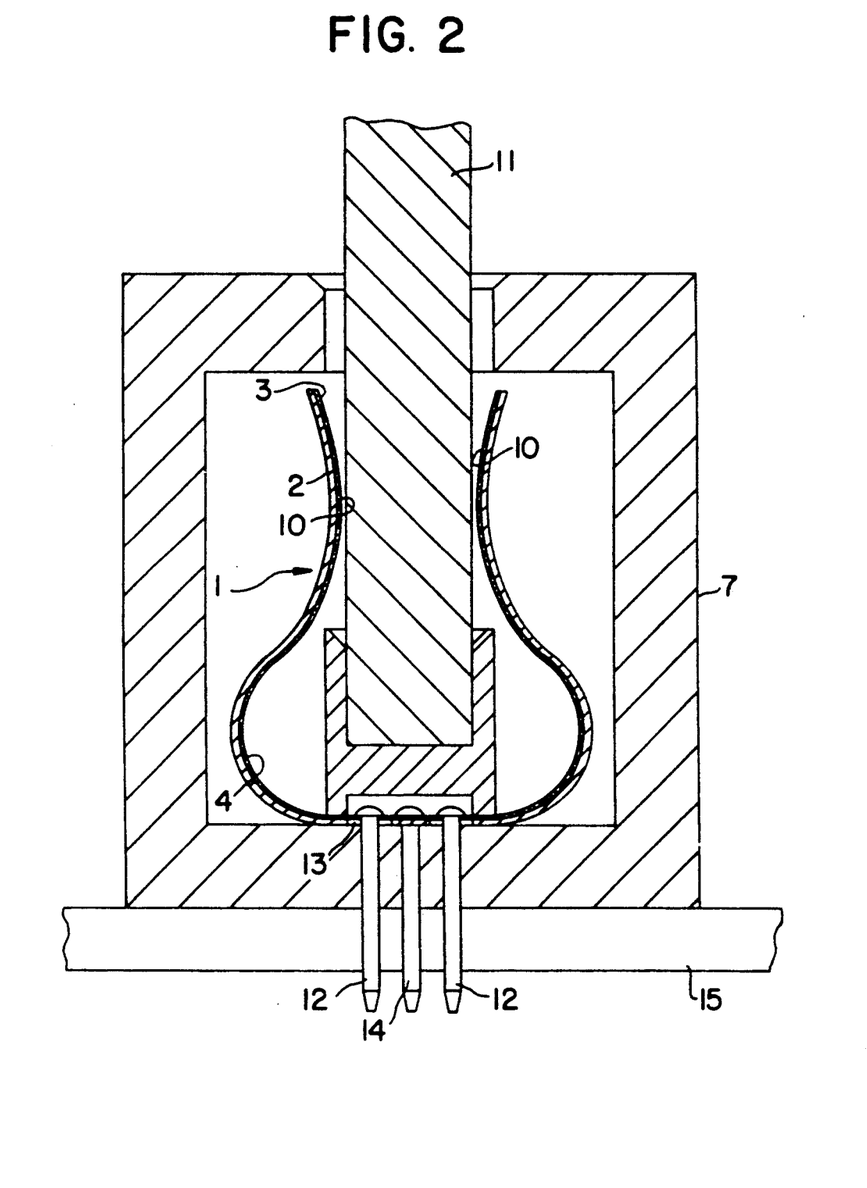
FIG. 2 schematically shows the use of the contact assembly of FIG. 1 in a connector element.

FIG. 1 shows a first embodiment of the contact assembly 1 comprising a strip-like support 2 and an insulating intermediate layer 3, upon which signal conductors 4 and contact pads 5 and 6 are provided. FIG. 1 shows the support 2 in perspective in a flat position, whereas FIG. 2 shows the contact assembly 1 as applied in a connector element 7 of the so-called direct edge type, wherein the support 2 has been given a desired shape for contacting an edge of a printed circuit board.

Slits 8 are provided at the opposite longitudinal edges of the strip-like support 2, whereby fingers 9 are obtained each carrying a contact pad 5 and a contact pad 6. As appears from FIGS. 1 and 2 each contact pad is provided with a contact button 10, wherein the strip-like support 2 is shaped in such a manner that the contact pads 5, 6 with the contact buttons 10 protrude so that as used in the connector element 7 the contact buttons 10 can contact corresponding contact pads of a printed circuit board 11 inserted into the connector element 7.

From FIG. 1 it appears that the contact pads 5 are connected with the signal conductors 4. In the embodiment shown the contact pads 6 are connected with the support 2 through a conductive plating of a hole indicated by a circle.

The contact pads 5 form signal contact pads, while the contact pads 6 form ground contact pads. The signal conductors 4 are connected with contact pins 12 substantially in the centre part of the support 2, which contact pins 12 project through openings 13 formed in the support 2 without contacting the material of the support 2. Ground contact pins 14 connected with the support 2 are provided between signal contact pins 12 of the signal conductors 4 successive in the longitudinal direction of the support 2.

The contact pins 12, 14 are inserted in plated through holes of a printed circuit board 15 and are connected with the circuit paths of this printed circuit board 15 in this manner.

The support 2 consists of a resilient conductive material, for example beryllium-copper which provides the mechanical strength and resilience for the signal conductors 4. The signal conductors 4 and the contact pads 5, 6 are made from a conductive layer, for example copper, which is provided on the insulating intermediate layer 3.

Figure 3:
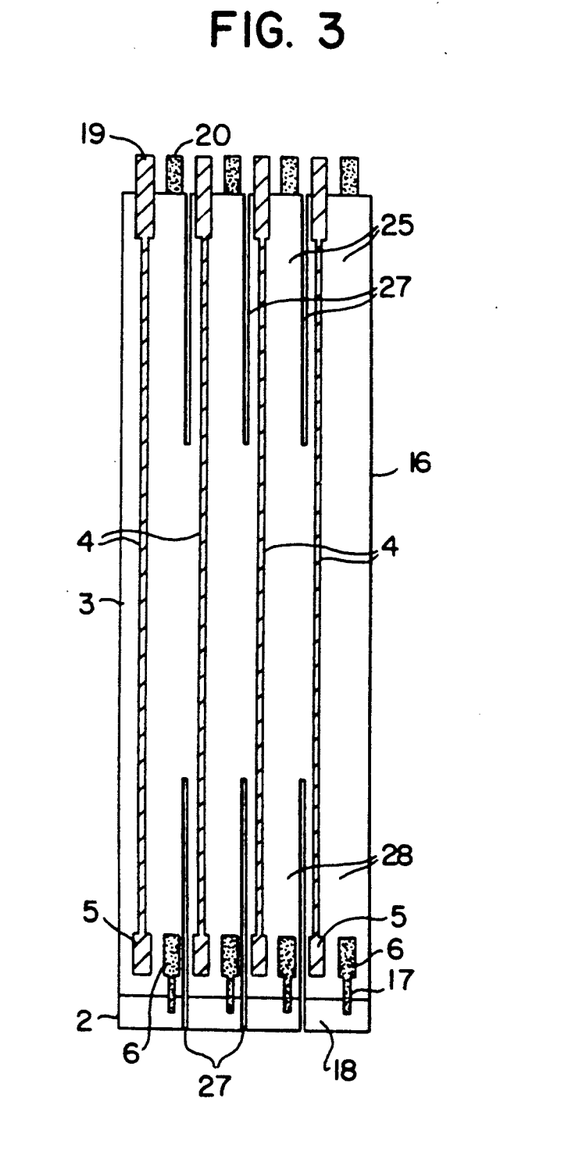
FIG. 3 is a top view of an alternative embodiment of the contact assembly according to the invention.
Figure 4:
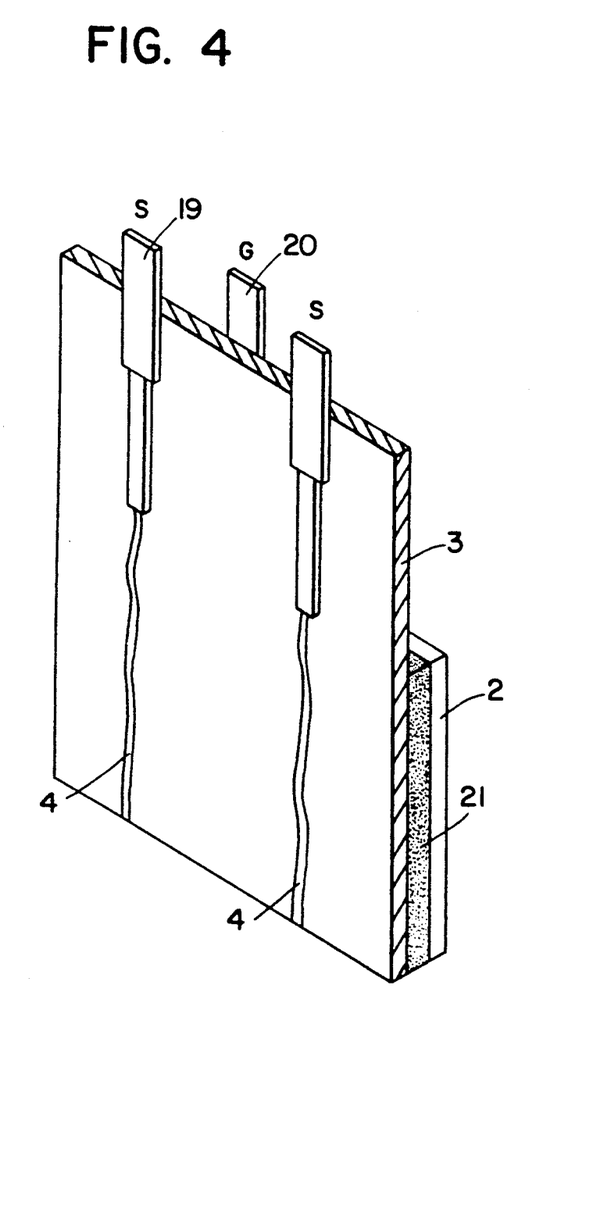
FIG. 4 is a perspective view on a larger scale of one longitudinal edge of the contact assembly of FIG. 3.

FIG. 3 shows a top view of a contact assembly 16 which in the same manner as contact assembly 1 comprises a strip-like support 2 with an insulating intermediate layer 3 upon which signal conductors 4 are provided. At one longitudinal edge contact pads 5 and 6 are also provided, wherein the contact pads 5 are connected with the signal conductors 4 and the contact pads 6 are connected through a short conductor 17 with the longitudinal edge 18 of the support 2 projecting beyond the insulating layer 3. At the opposite longitudinal edge of the support 2 contact pads 19 and 20 made as projecting contact tongues are provided, wherein the contact pads 19 are connected with the signal conductors 4 and the contact pads 20 are connected with the support 2. The longitudinal edge with the contact pads 19, 20 is shown at a larger scale in FIG. 4 showing that the contact pads 19, 20 consisting of conductive material are attached to the insulating intermediate layer 3, for example by bonding. In this case the insulating intermediate layer 3 will preferably consist of a layer coated with conductive material on both sides, wherein the support 2 is attached on one side by means of a conductive adhesive 21.

It will be understood that the proportions of the different layers in FIG. 4 are not shown to scale.

It is further noted that the contact pads 20 can be made out of the support 2 as an alternative. In this case, it is further possible to form supports for the contact pads 19 out of the support 2, so that the contact pads 19, 20 can operate as contact springs.

Figure 5:
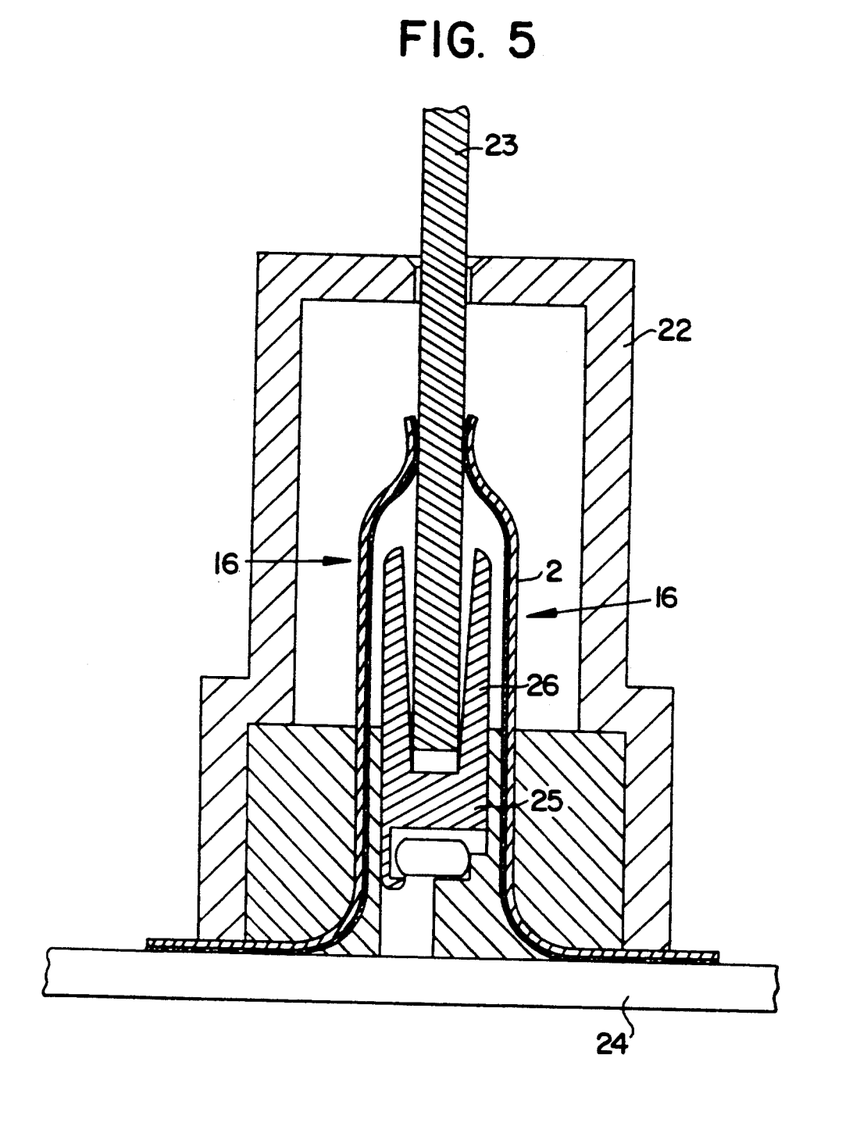
FIG. 5 schematically shows the use of two contact assemblies of FIG. 3 in a connector element.

FIG. 5 shows an application of the contact assembly 16 showing that the support 2 just as in the contact assembly 1, is shaped at the location of the contact pads 5, 6 in such a manner that these contact pads project, so that they can contact corresponding contact pads of a printed circuit board 23 inserted into a connector 22.

The contact pads 19, 20 are connected with contact pads of a printed circuit 24 in a manner not further shown.

The connector shown in FIG. 5 is a so-called zero insertion force type connector, wherein a moveable element 25 is provided, which is in a higher position when the printed circuit board 23 is not inserted so that the legs 26 press the contact assemblies 16 away.

Slits 27 are provided on both longitudinal edges of the support 2 so that fingers 28 are obtained each carrying a contact pad 5 and a contact pad 6 or a contact pad 19 and a contact pad 20, respectively.

Figure 6:
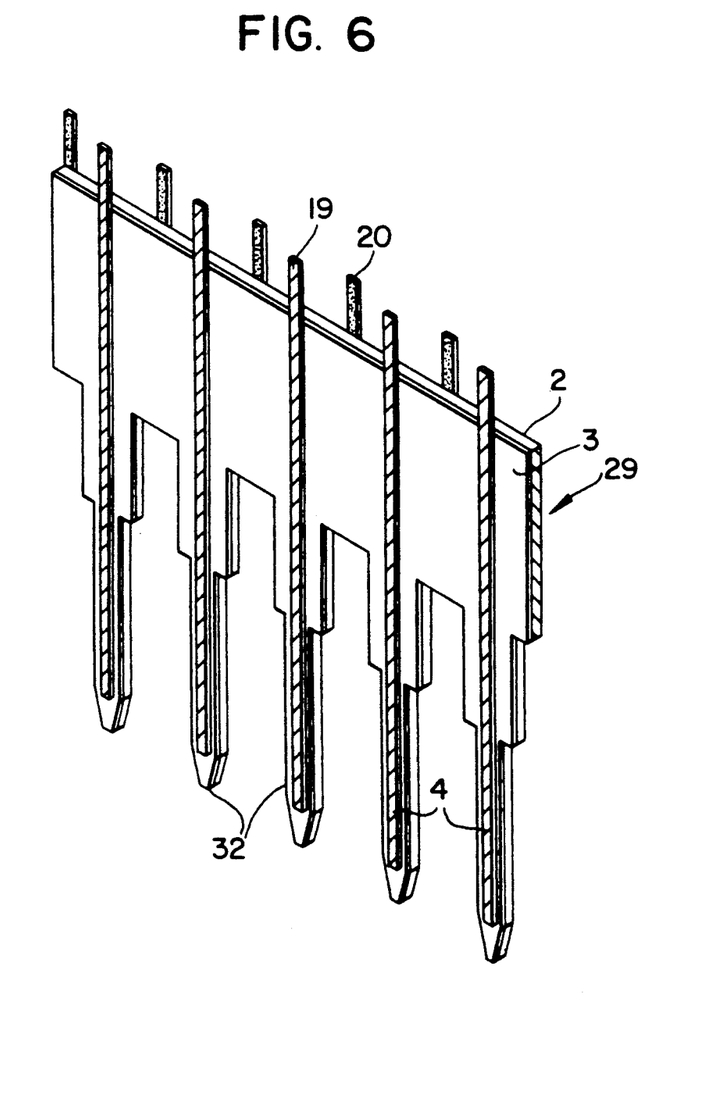
FIG. 6 is a perspective view of a third embodiment of the contact assembly according to the invention.
Figure 7:
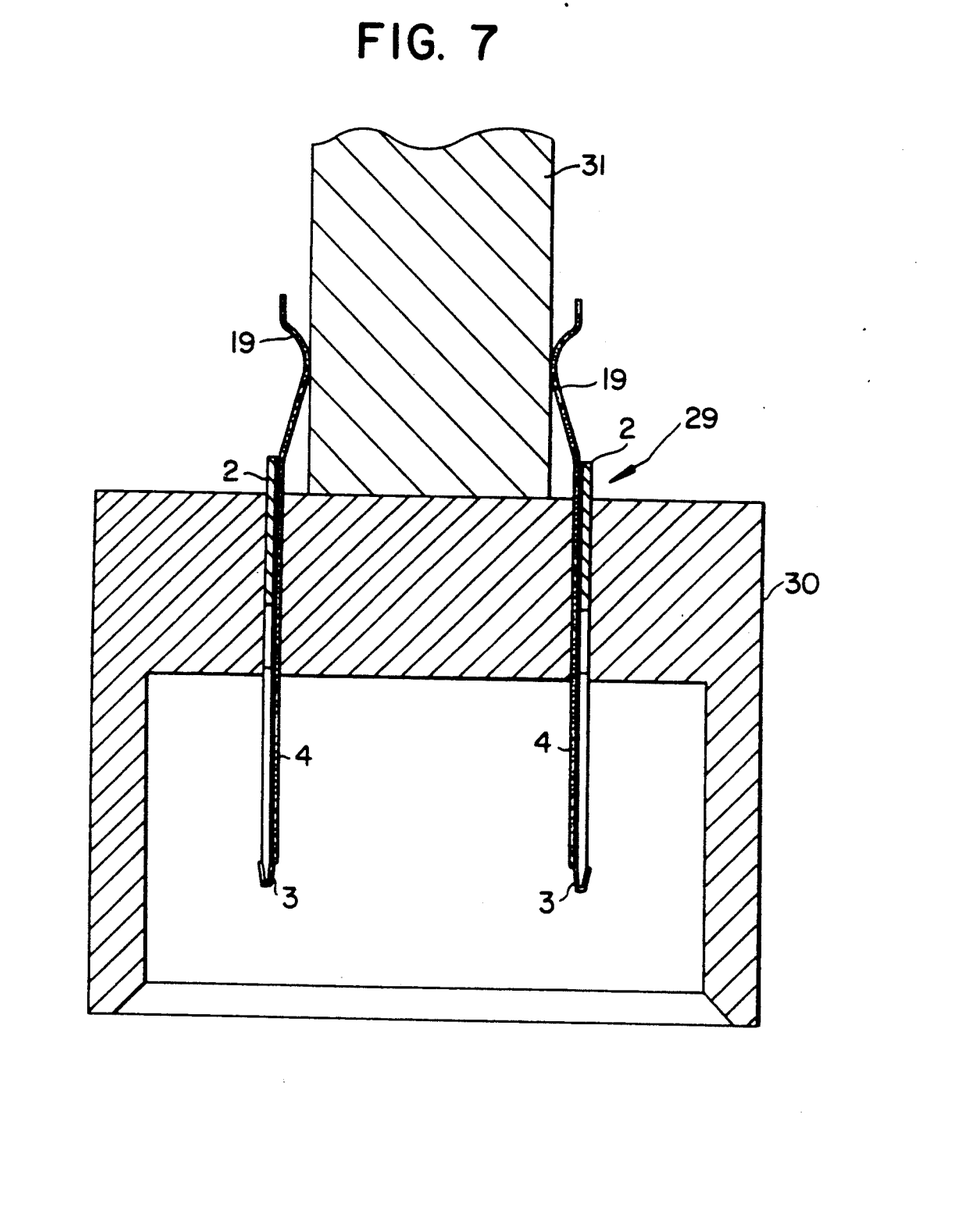
FIG. 7 schematically shows the use of the contact assembly of FIG. 6 in a connector element.

FIG. 6 shows a contact assembly 29 to be used in a so-called indirect connector 30 as shown in FIG. 7. In this case the contact assembly 29 comprises a support 2 with an insulating intermediate layer 3 having contact pads 19, 20 on one longitudinal edge provided in the manner as shown in FIG. 4. These contact pads 19, 20 are connected with corresponding contact pads of a printed circuit board 31 by soldering. The contact pads 19 and/or 20 can be made as contact springs in the same manner as described with respect to FIG. 4 for connection to the contact pads of the printed circuit board 31. At the opposite side male contacts 32 are made out of the support 2, wherein the signal conductors 4 extend from the contact pads 19 upto adjacent the end of the contact pins 32.

Figure 8:
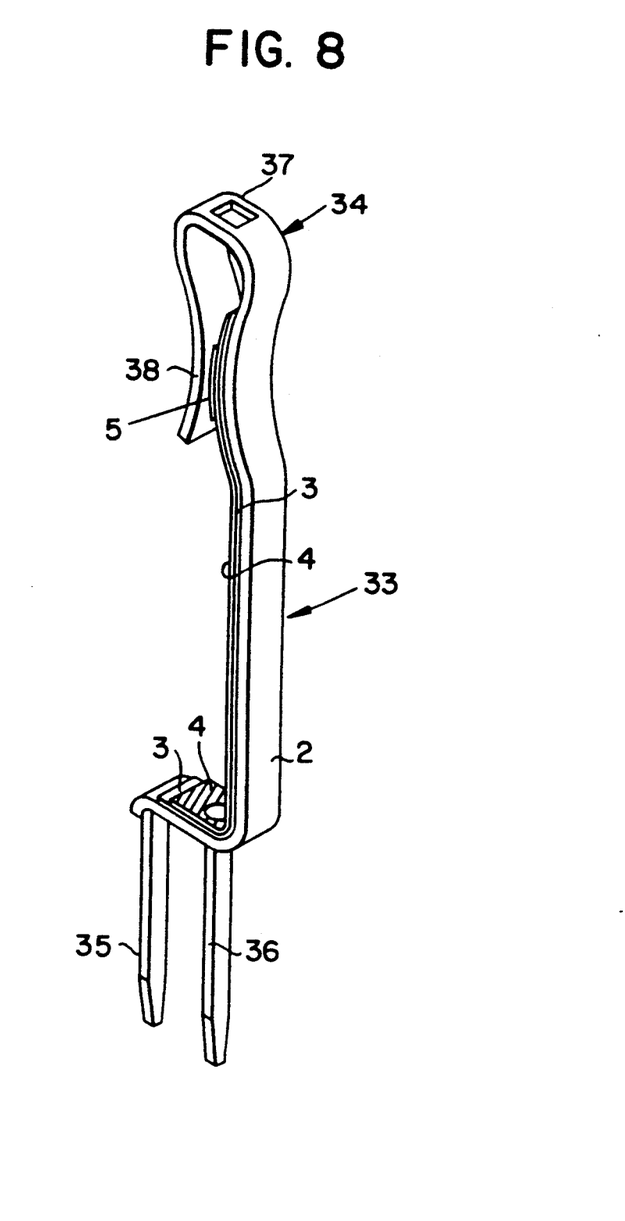
FIGS. 8 and 9 schematically show a perspective view and a side view, respectively, of two different embodiments of the contact assembly according to the invention.

FIG. 8 shows in perspective a contact assembly 33 according to the invention which is provided with a female contact element 34 adapted to cooperate with a contact pin 32 of the contact assembly 29. Each contact assembly 33 comprises a support 2 partially coated with an insulating intermediate layer 3, on which a signal conductor 4 is formed. A contact pin 35, for connection to a printed circuit board not shown is formed out of the support 2 at one longitudinal edge. At the same side of the support 2 a contact pin 36 is provided which is connected with the signal conductor 4 by welding or the like and which extends through an opening formed in the support 2 without contacting the support 2. At the other side of the support a contact pad 5 is provided on the intermediate layer 3. In the embodiment shown, the edge of the support 2 without the intermediate layer 3 is bent along 180° back towards the insulating intermediate layer 3 in such a manner that a mainly u-shaped edge 34 is obtained. At the location of the contact pad 5 the web 37 of the u-shaped edge 32 is provided with an opening for the passage of a contact pin 32, wherein the signal conductor 4 of the contact pin 32 will contact the contact pad 5 and the material of the support 2 will contact the free leg 38 of the u-shaped edge 34.

It will be clear that a number of contact assemblies 33 can be accommodated in a connector in a usual manner.

Figure 9:
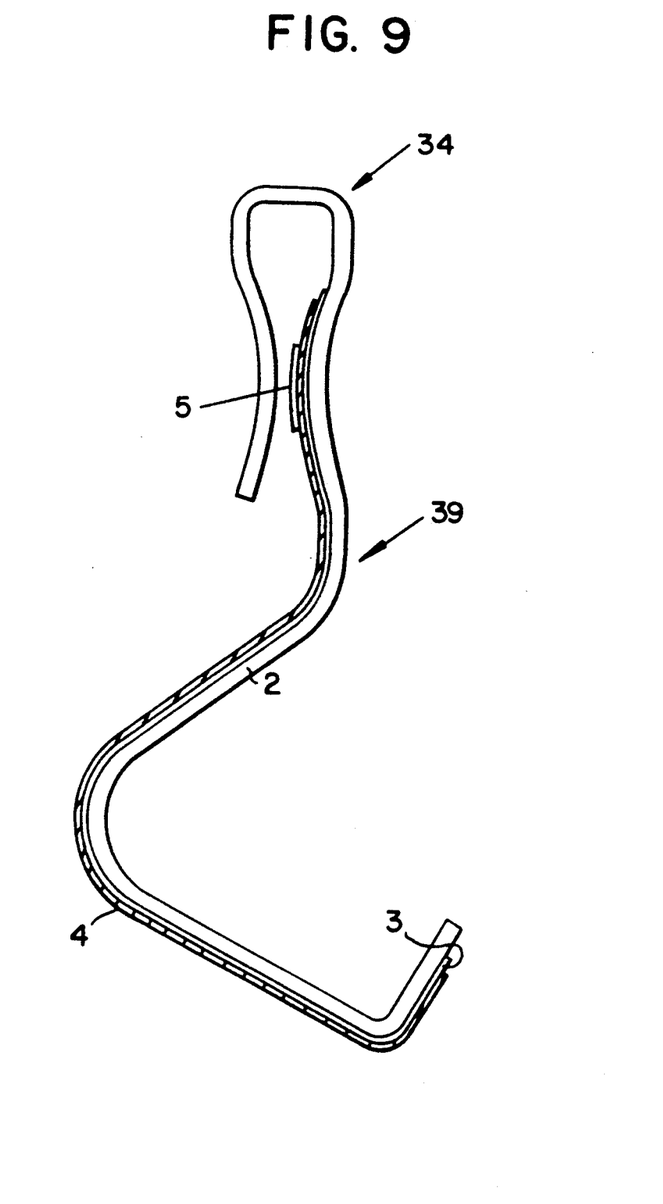

FIG. 9 shows an alternative contact assembly 39 to be used in combination with the contact assembly 29. The contact assembly 39 is provided with a u-shaped edge 34 in the same manner as the contact assembly 33. At the other longitudinal edge of the support 2 there are however provided contact pads 5, 6 on the insulating intermediate layer 3 in the same manner as in the contact assembly according to FIGS. 1 and 2 instead of contact pins, which contact pads 5, 6 are not visible in FIG. 9 and which are connected with the signal conductors 4 and the support 2, respectively.

Figure 10:
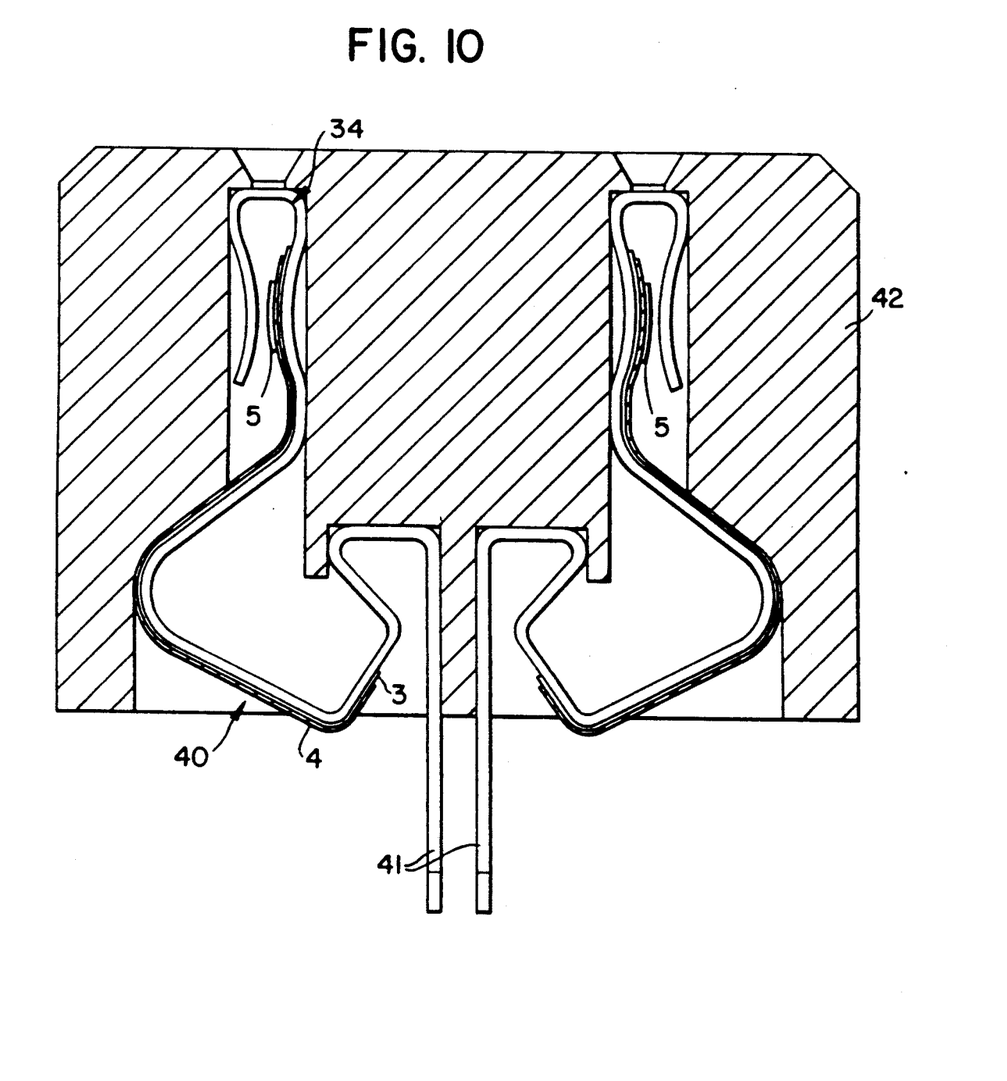
FIG. 10 schematically shows the use of a variant of the contact assembly of FIG. 9 in a connector element.

FIG. 10 shows a contact assembly 40 corresponding with the same of FIG. 9, wherein in this case contact pins 41 for connection to a printed circuit board are formed out of the edge opposite of the u-shaped edge 34. The insulating layer 3 only has signal contact pads 5 in this case, which contact pads 5 are connected with the signal conductors 4. FIG. 10 further shows a suitable housing 42 for the contact assembly 40. When the contact pins 41 are provided with a press-fit portion known per se, this embodiment has the advantage that the contact pins 41 also provide the required contact pressure for the contact pads 5.

Figure 11:
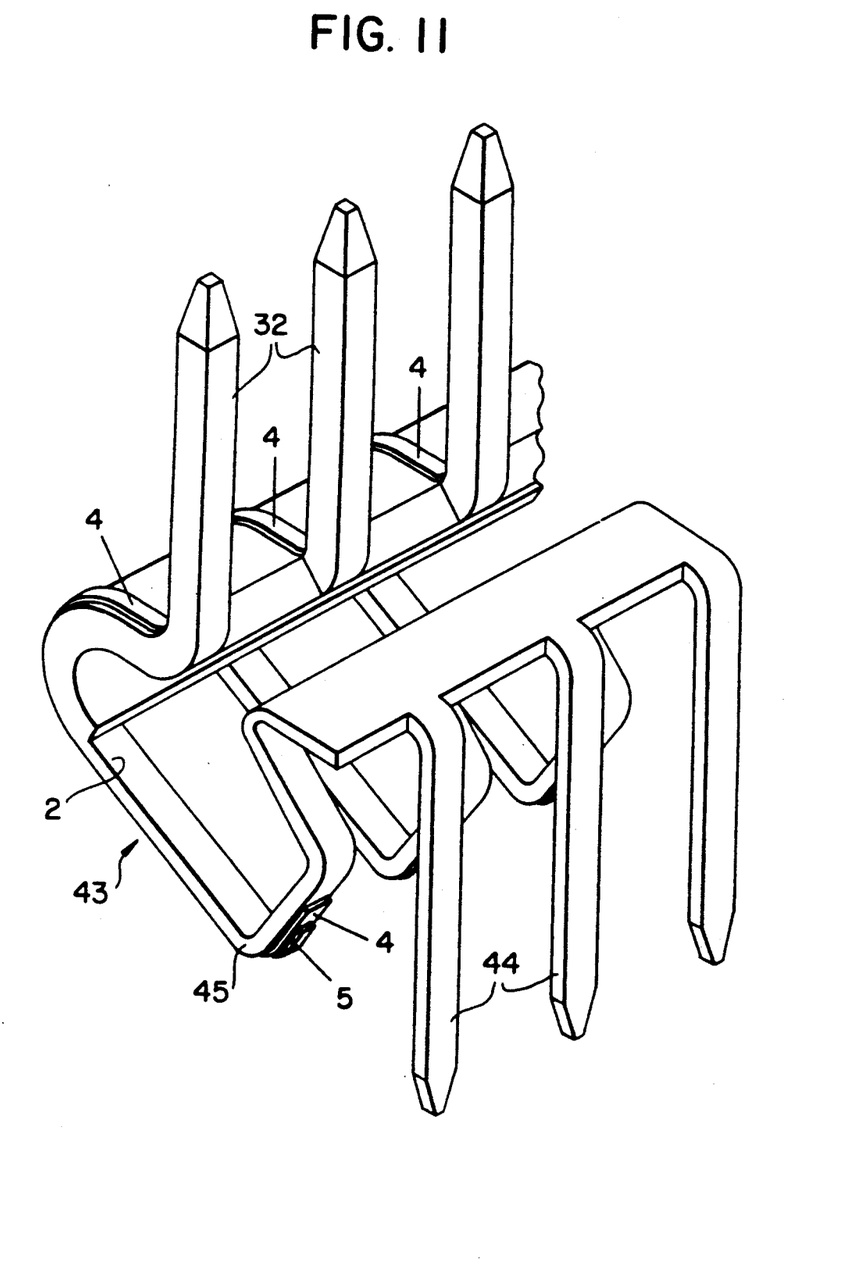
FIG. 11 perspectively shows a further embodiment of the contact assembly according to the invention.

Finally FIG. 11 shows in perspective a contact assembly 43, the support 2 of which is provided at one longitudinal edge with contact pins 44 for connection to a printed circuit board in the same manner as the contact assembly 40. At the other longitudinal edge male contact pins 32 are formed out of the support in the same manner as in the contact assembly 29 of FIG. 6. The signal conductors 4 extend along these contact pins 32 and end at a bent part 45 in contact pads 5 in the same manner as in the contact assemblies 39 and 40.

It is noted that the contact assemblies 33, 39 shown in FIGS. 8 and 9 can be made as a strip of contact assemblies in the same manner as with the contact assembly 43.

From the foregoing it will be clear that the invention provides a contact assembly wherein each signal conductor 4 with the opposite part of the support 2 separated from the same by the intermediate layer 3 forms a transmission line, wherein a desired impedance can be obtained by a suitable choice of the thickness of the insulating layer 3 and the width of the signal conductor 4. If polyimide is used as material for the intermediate layer 3 a thickness including any adhesive of 50 micron and a width of the signal conductor 4 of 200 micron results in an impedance of approximately 50 ohm. Thereby the electrical performance of the contacts can be taken into account from the beginning in designing the overall system from which the contact assembly forms a part. Signal distortions due to cross-over, transmission losses, reflections and ground bounce or switching noise will hardly occur.

The support 2 consisting of a resilient conductive material can be designed for optimum mechanical characteristics and the signal conductors 4 can be designed for optimum characteristics for signal transmission. An excellent signal integrity for the contacts of the contact assembly according to the invention is guaranteed because the contacts besides a controlled impedance further have a low capacity and low inductance. A connector equipped with the contact assembly according to the invention can have a high density of signal contacts because actually all contacts are signal contacts. The manufacturing costs of the contact assembly according to the invention are relatively low because a tooling change is not required to obtain contacts with different electrical properties. The signal conductors and contact pads can be formed in any desired pattern of the support 2.

It is noted that the several above-mentioned contact pins for connection to a printed circuit board can be provided with a press-fit portion in a usual manner.

Although in the above-described embodiments all signal conductors 4 operate as signal conductors, it is also possible to provide between each two adjacent signal conductors a signal conductor connected to ground in order to obviate any possible cross-over between signal conductors.

The invention is not restricted to the above-described embodiments which can be varied in a number of ways within the scope of the following claims.

We claim:

1. Contact assembly for use in a connector, the assembly comprising a support of resilient conductive material, an insulating intermediate layer provided on the support and at least one signal conductor supported on the insulating intermediate layer, wherein the support is used as a ground conductor characterized in that the support has a first edge provided as a plurality of parallel fingers, each finger having at least a portion of a signal conductor thereon and at least two adjacent contact pads for each signal conductor, the pads on each finger being adjacent the first edge of the support, wherein one contact pad of each of the adjacent pads is connected with the support and the other contact pad is connected to the respective signal conductor.

2. Contact assembly according to claim 1, wherein, at a second edge of the support for at least one of each signal conductor, contact pads for the support and the corresponding signal conductor(s), respectively, are provided for connection to corresponding contact pads of a printed circuit board.

3. Contact assembly according to claim 1 wherein the support is bent in such a shape at the location of the contact pads that said contact pads protrude for contacting corresponding contact pads of a complementary contact area.

4. Contact assembly according to claim 1 wherein the support is made as a strip, and wherein said fingers are separated from each other by slits.

5. Contact assembly according to claim 4 wherein a second set of fingers are formed at a second edge of the strip-like support, and wherein said second set of fingers are separated from each other by slits and each finger of said second set carries at least one of said contact pads.

6. Contact assembly according to claim 4, wherein contact pads (19, 20) are provided on both sides of the strip-like support at the first edge, wherein said signal conductors (4) extend from the corresponding contact pads (19) to an opposite edge (18) of the support (2).

7. Contact assembly according to claim 6 wherein said contact pads connected with the support are formed out of the support.

8. Contact assembly according to claim 6 wherein the contact pads located at the first edge of the support are contact tongues (19, 20).

* * * * *